(12) United States Patent
Hsu

(10) Patent No.: US 6,534,818 B2
(45) Date of Patent: Mar. 18, 2003

(54) STACKED-GATE FLASH MEMORY DEVICE

(75) Inventor: Scott Hsu, Yunlin Hsien (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/922,720

(22) Filed: Aug. 7, 2001

(65) Prior Publication Data

US 2003/0030096 A1 Feb. 13, 2003

(51) Int. Cl.[7] .............................................. H01L 29/76
(52) U.S. Cl. ...................... 257/314; 257/314; 257/315; 257/316; 257/318; 257/319; 438/201; 438/211; 438/257; 438/266
(58) Field of Search ................................ 257/314, 315, 257/316, 318, 319; 438/201, 211, 257, 266

(56) References Cited

U.S. PATENT DOCUMENTS

| | | | | |
|---|---|---|---|---|
| 5,282,160 A | * | 1/1994 | Yamagata | 365/185 |
| 5,753,561 A | * | 5/1998 | Lee et al. | 438/424 |
| 5,949,126 A | * | 9/1999 | Dawson et al. | 257/513 |
| 5,968,842 A | * | 10/1999 | Hsiao | 438/692 |
| 6,133,105 A | * | 10/2000 | Chen et al. | 438/296 |
| 6,150,237 A | * | 11/2000 | Lee | 438/433 |
| 6,177,332 B1 | * | 1/2001 | Chen et al. | 438/429 |
| 6,197,639 B1 | * | 3/2001 | Lee et al. | 438/258 |
| 2001/0052611 A1 | * | 12/2001 | Kim | 257/296 |
| 2001/0054735 A1 | * | 12/2001 | Nagai | 257/314 |

* cited by examiner

Primary Examiner—George C. Eckert, II
Assistant Examiner—Edgardo Ortiz
(74) Attorney, Agent, or Firm—Intellectual Property Solutions, Inc.

(57) ABSTRACT

A novel flash memory structure is disclosed, which includes a tunnel oxide layer on a semiconductor substrate, an array of gate electrode stacks formed on the tunnel oxide layer, and alternating source/drain regions formed between the stacks. A first dielectric layer is formed over the stacks and the substrate with a source line opening down to the source regions. A source line is formed above the source regions, partially filling the source line opening. The source line is located between the gate electrode stacks and has a surface level below a top surface of the stacks. A second dielectric layer is formed over the source line and the first dielectric layer with a plug opening down to the drain regions. A drain metal plug is formed over the drain regions, filling the plug opening. A metal bit line is formed over the second dielectric layer contacting the drain metal plug.

9 Claims, 2 Drawing Sheets

STACKED-GATE FLASH MEMORY DEVICE

BACKGROUND OF THE INVENTION

1. Field of the Invention

The present invention relates in general to a semiconductor memory device, and more particularly to a stacked-gate flash memory device.

2. Description of the Related Arts

In the era of portable systems, flash memory technology is driven to develop a high-density cell with low bit cost and low power consumption.

To realize low bit cost, it is indispensable to reduce the cell size and the number of process steps. For significant reduction in cell size, self-aligned shallow trench isolation (STI) is proposed. The use of STI results in minimized bit line pitch and small cell size.

A high-density flash memory is described in the article "A 0.15 $\mu$m NAND Flash Technology with 0.11 $\mu m^2$ Cell size for 1 Gbit Flash memory," Jung-Dal Choi et al., IEEE, 2000. To interconnect the NAND cell array, the poly-Si source is connected to every string as a common line and the tungsten bit line is damascened over the entire string. These double-layers interconnection leads to simple process and reduced steps.

Another high-density flash memory is described in the article "Novel 0.44 $\mu m^2$ Ti-Salicide STI cell Technology for High Density NOR Flash Memories and High Performance Embedded Application," H. Watanabe et al., IEEE, 1998. The high-density flash memory has shallow trench isolation, Ti-silicided polysilicon gate and source/drain, and tungsten local inter-connect source line.

SUMMARY OF THE INVENTION

An object of the invention to provide a novel stacked-gate flash memory structure.

The memory device of the present invention is featured by comprising a source line between gate electrode stacks that has a surface level below a top surface of the stacks. Such "recessed" source line prevents short between source line and control gate when the control gate is exposed from source line opening due to misalignment.

In addition, the memory device of the present invention is featured by comprising shallow trench isolation structures that are recessed below the substrate surface. Such recessed isolation regions can provide low resistance and reduce flash cell size.

The memory device of the present invention comprises: a semiconductor substrate; a tunnel oxide layer on the substrate; an array of gate electrode stacks formed on the tunnel oxide layer, the gate electrode stacks including a floating gate electrode over the tunnel oxide layer, an inter-gate dielectric layer over the floating gate electrode, a control gate electrode over the inter-gate dielectric layer; alternating source/drain regions formed between the stacks; a first dielectric layer over the stacks, and the substrate, the first dielectric layer having a source line opening down to the source regions; a source line partially filling the source line opening and contacting the source regions through the source line openings, the source line being located between the stacks and having a surface level below a top surface of the stacks; a second dielectric layer over the source line and the first dielectric layer, the second dielectric layer having a plug opening down to the drain regions; a drain metal plug filling the plug opening in contact with the drain regions, the drain metal plug being located over the drain regions and between the stacks; and a metal bit line formed over the second dielectric layer contacting the drain metal plug. Furthermore, the memory device may further comprise shallow trench isolation (STI) structures have a surface level below the substrate surface, and preferably between the substrate surface and the junction depth of the source/drain regions.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENT

Figure 1:
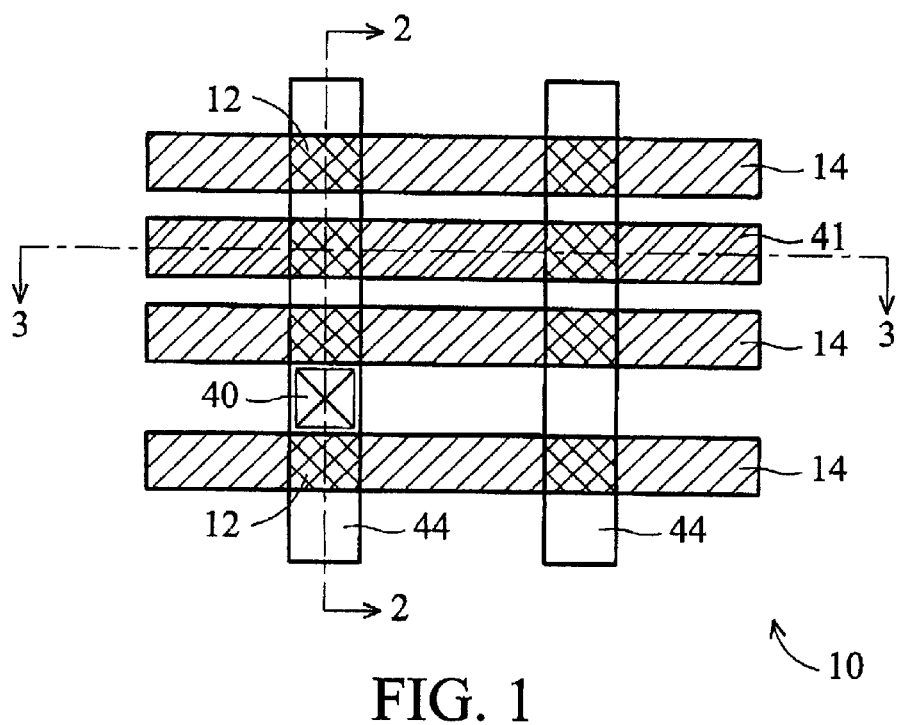
FIG. 1 is a plan view of a flash memory device according to a preferred embodiment of the invention.
Figure 2:
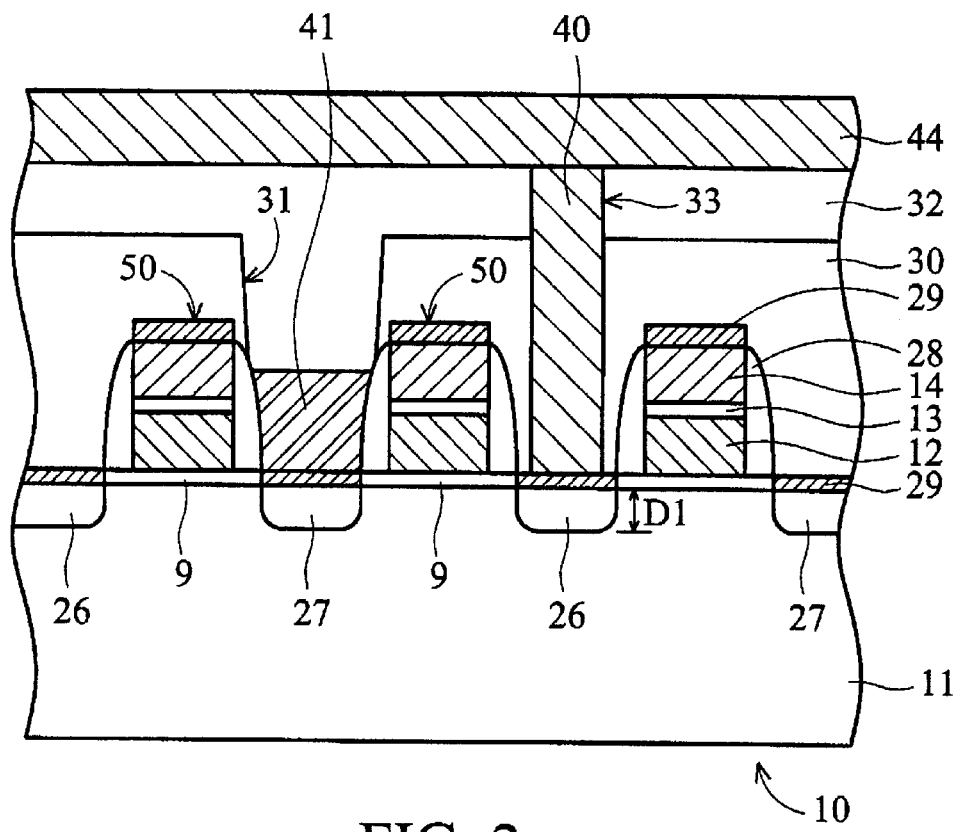
FIG. 2 is a sectional view of the device of FIG. 1 taken along line 2—2 of FIG. 1.

Referring now to FIG. 1, there is shown, in plan view, a flash memory device 10 according to a preferred embodiment of the invention. FIG. 2 is a sectional view of the device of FIG. 1 taken along line 2—2 in FIG. 1. The flash memory device 10 is formed on a P-lightly doped silicon semiconductor substrate 11 upon which a tunnel oxide layer 9 comprising silicon oxide has been formed having a thickness between about 70 Å to 120 Å. Over tunnel dielectric layer 9 are formed stacks 50 of floating gate electrodes 12, an inter-gate dielectric layer 13, and control gate electrodes 14. The stacks 50 have sidewalls on the edges of the floating gate electrodes 12, inter-gate dielectric layer 13, and control gate electrodes 14.

The floating gate electrodes 12 are composed of doped polysilicon, formed from a floating gate layer. Preferably, the floating gate electrode has a thickness between about 1000 Å to 4000 Å, and is formed through an LPCVD (low pressure chemical vapor deposition) method employing silane ($SiH_4$) as a silicon source material at a temperature range between about 530° C. to 650° C. Above the floating gates 12, a inter-gate dielectric layer 13 such as a ONO (oxide/nitride/oxide) or $Ta_2O_5$ layer has been deposited with a thickness between about 250 Å to 300 Å. Formed above the inter-gate dielectric layer 13, are control gate electrodes 14 composed of a second doped polysilicon layer. Control gate electrodes preferably have a thickness between about 3000 Å to 4000 Å.

Between the stacks 50, in the silicon semiconductor substrate 11 are formed doped drain regions 26 and source regions 27. The drain regions 26 and source regions 27 are ion implanted regions with a concentration of implanted atoms between about $1\times10^{15}$ to $5\times10^{15}$ atoms/$cm^3$. The source and drain regions have a junction depth D1.

On sidewalls of the stacks 50 are formed silicon nitride spacers 28 covering the edge surfaces of gate electrodes 12, 14, and inter-gate dielectrics 13. The sidewall spacers 28 preferably has a thickness between about 1,500 Å to 2,000 Å. The $N^+$ implant is done after spacer formation to form source and drain junction.

Above the control gate electrodes 14 and the source and drain regions 26, 27 are formed self-aligned silicides (salicides) 29, which results in high-speed operation of memory array. Preferably, silicides 29 are cobalt silicides ($Co_2Si$) having a thickness between about 1,000 Å to 2,000 Å.

Above the stacks 50 are formed planarized interlayer dielectric (ILD) 30 with a thickness between about 3,000 Å to 4,000 Å. Preferably, the interlayer dielectric 30 is composed of BP-TEOS (tetraethylorthosilicate). The interlayer dielectric 30 is formed with an opening 31 between the stacks 50 down to the source region 27.

A source line 41 has been formed above the source region 27, between the stacks 50 of floating gates 12, inter-gate dielectrics 13, and control gates 14, partially filling the opening 31. The source line 41 reaches down between spacers 28 into contact with the source region 27. As a main feature and key aspect of the present invention, the source line 41 has a surface level below the top surface of the control gate 14 are shown. In comparison to conventional source line which completely fills the opening 31 and has a surface coplanar with the ILD 30, the "recessed" source line 41 prevents short between source line and control gate when the control gate is exposed from the source line opening 31 due to misalignment. This misalignment becomes more critical as the cell dimension scales down. The present invention can therefore provide higher device yields and better device reliability. The source line 41 can be composed of tungsten, titanium, doped-Si, or combinations thereof.

An intermetal dielectric (IMD) layer 32 with a thickness of about 10,000 Å to 12,000 Å is formed above the ILD layer 30. The IMD layer 32 has been formed with an plug opening 33 down to the drain region 26, but covering the source line 41 over the source region 27. The IMD layer 32 may consist of one or more commonly used dielectric materials in semiconductor processing. For example, the IMD layer 32 can be selected from the group consisting of silicon dioxide, borosilicate glass (BSG), borophosphosilicate glass (BPSG), phosphosilicate glass (PSG), spin-on glass (SOG), and low-k materials such as fluorosilicate glass (FSG).

A metal plug 40 is formed above the drain region 26, completely filling the plug opening 33. The metal plug 40 reaches down between spacers 28 into contact with the drain region 27. The metal plug 40 is preferably composed of tungsten.

A metal bit-line material with a thickness between about 7,000 Å to 8,000 Å has been deposited as a blanket layer over the IMD layer 32, and then etched to provide the metal bit-lines 44.

In FIG. 1, the location of the contacts with the drain region 26 below is indicated by X marking. The source line 41 over the source regions 27 extend from front to back. The metal bit-lines 44 which contact the drain plug 40 bridge over the top surface of the IMD layer 32 as shown in FIG. 2.

Figure 3:
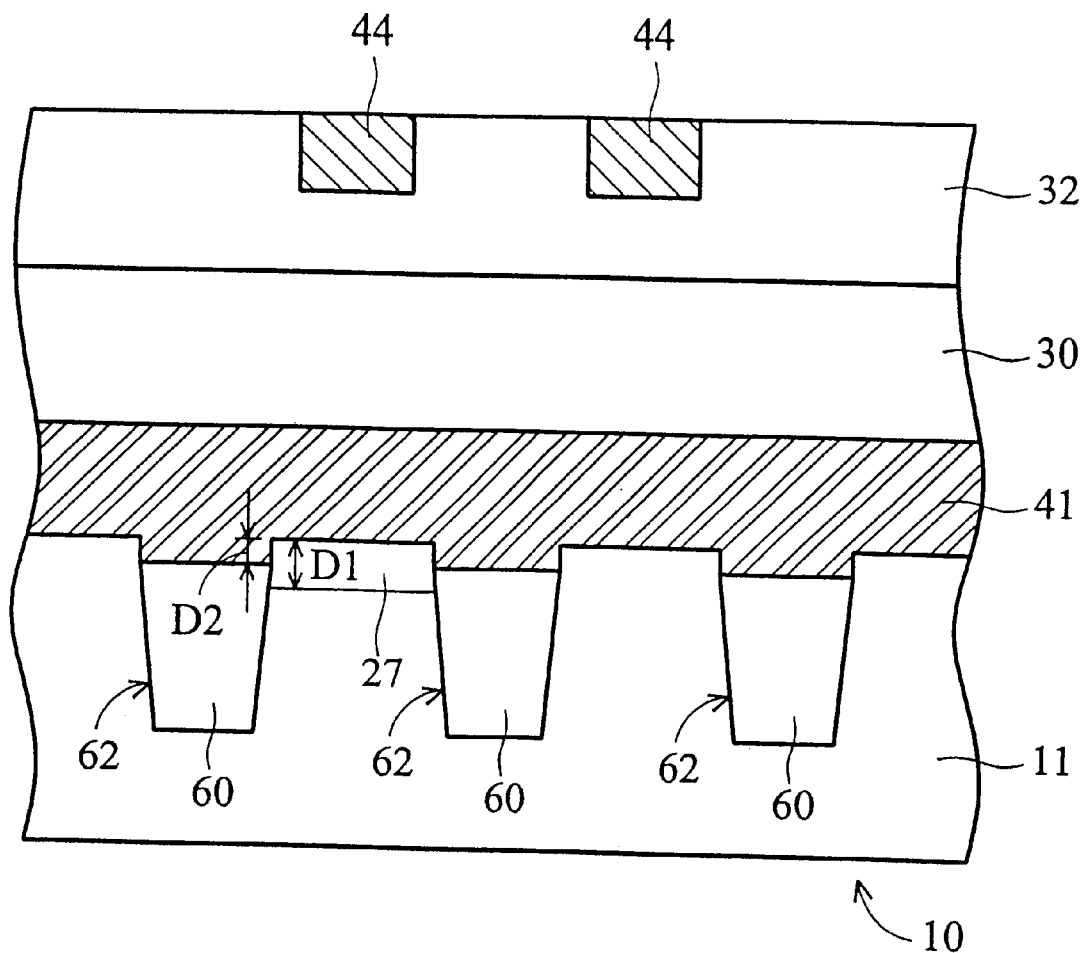
FIG. 3 is a sectional view of the device of FIG. 1 taken along line 3—3 in FIG. 1.

FIG. 3 is a section taken along line 3—3 in FIG. 1 which shows a set of shallow trench isolation (STI) structures extending partially down into the substrate 11. The STI structures 60 are formed by filling isolation trenches 62 with an isolation oxide layer, followed by chemical mechanical polishing (CMP) or etch back. As another key aspect of the present invention, the surface of the STI structures 60 is recessed below the substrate surface. However, the recess D2 should not below the junction depth D1 of the source and drain regions. The surface level of the STI structures 60 is preferably between the substrate surface and the junction depth of the source and drain regions (that is, $0<D1<D2$).

While the invention has been particularly shown and described with reference to the preferred embodiment thereof, it will be understood by those skilled in the art that various changes in form and details may be made without departing from the spirit and scope of the invention.

What is claimed is:

1. A memory device, comprising:

a semiconductor substrate;

a tunnel oxide layer on the substrate;

an array of gate electrode stacks formed on the tunnel oxide layer, the gate electrode stacks including a floating gate electrode over the tunnel oxide layer, an inter-gate dielectric layer over the floating gate electrode, a control gate electrode over the inter-gate dielectric layer;

alternating source/drain regions formed between the stacks, wherein the source/drain regions have a junction depth and the junction depth has a bottom surface;

a first dielectric layer over the stacks, and the substrate, the first dielectric layer having a source line opening down to the source regions;

a source line partially filling the source line opening and contacting the source regions through the source line openings, the source line being located between the stacks and having a surface level below a top surface of the stacks;

a second dielectric layer over the source line and the first dielectric layer, the second dielectric layer having a plug opening down to the drain regions;

a drain metal plug filling the plug opening in contact with the drain regions, the drain metal plug being located over the drain regions and between the stacks;

a metal bit line formed over the second dielectric layer contacting the drain metal plug; and shallow trench isolation (STI) structures having a surface level between the substrate surface and the bottom surface of the junction depth of the source/drain regions.

2. The memory device as claimed in claim 1, wherein the floating gate electrode comprises doped polysilicon.

3. The memory device as claimed in claim 1, wherein the control gate electrode comprises doped polysilicon.

4. The memory device as claimed in claim 1, further comprising silicides formed over the control gate electrode and the source/drain regions.

5. The memory device as claimed in claim 4, wherein the silicides are cobalt silicide.

6. The memory device as claimed in claim 1, further comprising spacers formed on sidewalls of the gate electrode stacks.

7. The memory device as claimed in claim 6, wherein the spacers comprises silicon nitride.

8. The memory device as claimed in claim 1, wherein the source line is formed of a material selected from the group consisting of tungsten, titanium, doped-Si, and combinations thereof.

9. The memory device as claimed in claim 1, wherein the metal plug comprises tungsten.

* * * * *